United States Patent [19]

Lindeboom

[11] Patent Number: 5,657,238

[45] Date of Patent: Aug. 12, 1997

[54] RESISTANCE MEASURING CIRCUIT, AND THERMAL APPARATUS INCLUDING THE MEASURING CIRCUIT

[75] Inventor: Wieger Lindeboom, Drachten, Netherlands

[73] Assignee: U.S. Philips Corporation, New York, N.Y.

[21] Appl. No.: 417,181

[22] Filed: Apr. 5, 1995

[30] Foreign Application Priority Data

Apr. 5, 1994 [EP] European Pat. Off. ............ 94200918

[51] Int. Cl.$^6$ ............................................. G01R 27/00
[52] U.S. Cl. .................. 364/483; 364/481; 364/557; 364/482; 364/556; 324/711; 324/677; 324/678
[58] Field of Search ........................ 364/556, 557, 364/481–483; 324/607, 677, 711, 679, 678; 340/589; 341/172, 118, 167; 374/184, 185; 236/11, 1 G, 1 B, 49.3; 165/16, 22, 26

[56] References Cited

U.S. PATENT DOCUMENTS

| | | | |
|---|---|---|---|
| 3,790,890 | 2/1974 | Veittau et al. | 324/189 |
| 4,841,458 | 6/1989 | Levine et al. | 364/557 |
| 4,910,689 | 3/1990 | Shibamiya | 364/556 |
| 4,929,886 | 5/1990 | Toshiyuhi | 324/691 |
| 5,274,334 | 12/1993 | Mills | 324/678 |

*Primary Examiner*—Emanuel T. Voeltz
*Assistant Examiner*—Hal D. Wachsman
*Attorney, Agent, or Firm*—Ernestine C. Bartlett

[57] ABSTRACT

A dual-slope measuring circuit for measuring an unknown resistance. A first time measurement measures the time which is needed to charge a capacitor to a first reference voltage ($U_{ref_1}$) via a reference resistor. A second time measurement measures the time which is needed to charge the capacitor again to the first reference voltage ($U_{ref_1}$) but now via the parallel arrangement of the reference resistor and the unknown resistance. The value of the unknown resistance is determined from the ratio between the two time intervals thus measured. The time measurement is not started until the capacitor voltage ($U_c$) on the capacitor has passed a second reference voltage ($U_{ref_2}$), where the second reference voltage has a value between the first reference voltage and the capacitor voltage ($U_c$) appearing across the capacitor immediately after discharge of the capacitor.

30 Claims, 5 Drawing Sheets

RESISTANCE MEASURING CIRCUIT, AND THERMAL APPARATUS INCLUDING THE MEASURING CIRCUIT

BACKGROUND OF THE INVENTION

This invention relates to a measuring circuit for measuring the resistance value of a resistor, which circuit comprises:

a capacitor, a first resistor and a second resistor which can be coupled to the capacitor for charging the capacitor, thereby forming a capacitor voltage discharge means for discharging the capacitor, a first reference voltage source for generating a first reference voltage, first comparison means for comparing the capacitor voltage with the first reference voltage and for generating a first detection signal when the capacitor voltage passes the first reference voltage, time measurement means for measuring a first time interval which, after discharging of the capacitor by the discharge means, terminates upon the occurrence of the first detection signal during charging of the capacitor via the first resistor, and for measuring a second time interval which, after discharging of the capacitor by the discharge means, terminates upon the occurrence of the first detection signal during charging of the capacitor via at least the second resistor.

The invention also relates to a thermal appliance, an electrical thermometer and a cold-generating appliance including such a measuring circuit.

Such a measuring circuit is known from U.S. Pat. No. 4,910,689. After it has been discharged the capacitor is charged via the first resistor and the time is measured which is required to charge the capacitor until the capacitor voltage has become equal to the first reference voltage. This measurement is the first measurement and the measured time is the first time interval. Subsequently, the second resistor is arranged in parallel with the first resistor and the capacitor is discharged again. After this, the capacitor is charged again but now via the parallel-connected first resistor and second resistor, and again the time is measured which is needed to reach the first reference voltage. This measurement is the second measurement and the measured time is the second time interval. The ratio between the first and the second time interval is equal to the ratio between the resistance value of the first resistor and the resistance value of the parallel-connected first resistor and second resistor. The resistance value of either the first or the second resistor is known, which is the reference resistance, so that the value of the other resistor, i.e. the unknown resistance to be measured, can be calculated from the ratio.

In the known measuring circuit the second resistor is arranged in parallel with the first resistor during the second measurement. The first resistor is connected permanently to the capacitor. However, it is also possible to charge the capacitor exclusively via the second resistor during the second measurement. The first resistor is then disconnected during the second measurement. The value of the unknown resistance can then again be derived from the ratio between the measured time intervals.

The unknown resistance may be a temperature-dependent resistance, for example, a thermistor or an NTC (negative temperature coefficient) resistor. The measured resistance is then a measure of the temperature of the resistor. In that case the measuring circuit is very suitable for use in electrically heated appliances such as a flat-iron, coffee maker, electric kettle, deep fryer, roaster, cook-top, oven, grill, hot-plate, room-heating appliance, radiant heater, fan heater, hair dryer, hair curler, bread toaster, sandwich toaster, electric blanket and the like, electrical thermometers and cold-generating appliances such as an icemaker, food processor, refrigerator, deepfreezer, air conditioner and the like.

During the discharge of the capacitor two currents will flow through the discharge means. Firstly, a discharge current which decreases to zero as a result of the short-circuit of the capacitor. Secondly, a substantially constant charging current whose magnitude at the beginning of the first measurement is mainly determined by the first resistance and at the beginning of the second measurement by the parallel-connected first and second resistance. Owing to the finite impedance of the discharge means the charging current produces a voltage drop across the discharge means, which voltage drop will be left across the capacitor as a residual voltage at the beginning of the first or the second measurement when the discharge path of the discharge means is opened. The residual voltage influences the time required to charge the capacitor to the first reference voltage and hence the lengths of the first and the second time intervals. During the second measurement the first and the second resistor are in parallel, so that the charging current at the beginning of the second measurement is larger than at the beginning of the first measurement. Consequently, the residual voltages across the capacitor also differ per measurement. Moreover, if the unknown resistor is an NTC resistor this difference in residual voltages also varies as a function of temperature. These residual voltages consequently result in an inaccurate measurement.

SUMMARY OF THE INVENTION

It is an object of the invention to improve the accuracy of the measuring circuit defined above and to this end the invention is characterised in that the measuring circuit further comprises:

a second reference voltage source for supplying a second reference voltage which lies between the first reference voltage and the capacitor voltage immediately after discharge of the capacitor, second comparison means for comparing the capacitor voltage with the second reference voltage and for generating a second detection signal when the capacitor voltage passes the second reference voltage, and in that the first time interval and the second time interval start upon the occurrence of the second detection signal.

The time measurement is delayed until the capacitor voltage has increased sufficiently. This is signalled by the second detection signal and the time measurement is not started until then. As a result, the residual voltage across the capacitor no longer adversely affects the measurement results. Furthermore, the ohmic resistance of the discharge switch (e.g. a transistor) and the spread of this resistance also do not now affect the measure accuracy.

A substantial reduction of the number of parts can be obtained with an embodiment which is characterised in that the first comparison means and the second comparison means are united in a single comparator, and in that the first reference voltage source and the second reference voltage source are united in a single reference voltage source whose reference voltage is switchable from the second reference voltage to the first reference voltage after the occurrence of the second detection signal.

According to the invention a simple single reference voltage source with a switchable reference voltage is characterised in that the single reference voltage source comprises:

a voltage divider with a series arrangement of a third resistor and a fourth resistor, a fifth resistor, and switching means for connecting the fifth resistor and the third resistor in parallel before the occurrence of the second detection signal and for connecting the fifth resistor and the fourth resistor in parallel after the occurrence of the second detection signal.

BRIEF DESCRIPTION OF THE DRAWING

These and other aspects of the invention will be described and elucidated with reference to the accompanying drawings, in which.

In these Figures like elements bear the same reference numerals.

DESCRIPTION OF THE PREFERRED EMBODIMENT

Figure 1:
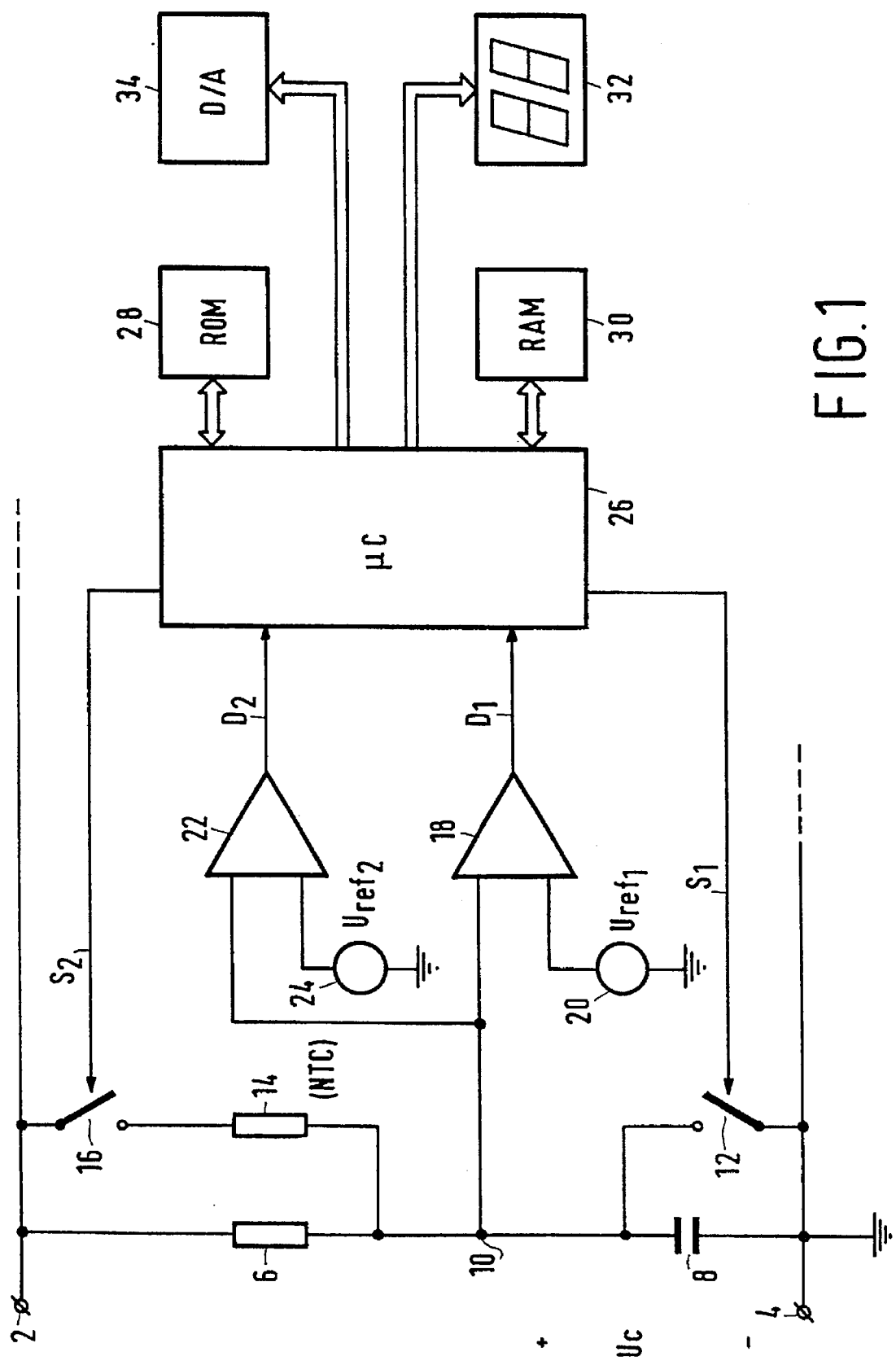
FIG. 1 shows a first circuit diagram of a measuring circuit in accordance with the invention.

FIG. 1 shows a measuring circuit in accordance with the invention. A series arrangement of a first resistor 6 and a capacitor 8, which are connected to one another at a node 10, is connected between a positive supply terminal 2 and a negative supply terminal 4, which is assumed to be ground. A discharge switch 12 is arranged in parallel with the capacitor 8 and can be opened and closed by means of a first switching signal $S_1$. A series arrangement of a second resistor 14 and a parallel switch 16 is arranged in parallel with the first resistor 6. The parallel switch 16 can be opened and closed by means of a second switching signal $S_2$, as a result of which the second resistor 14 is connected in parallel or is not connected in parallel with the first resistor 6. A first comparator 18 has one input connected to the node 10 and has another input connected to a first reference voltage source 20, which generates a first reference voltage $Uref_1$. The first comparator 18 supplies a first detection signal $D_1$, whose value changes if the capacitor voltage Uc on the node 10 passes the first reference voltage $Uref_1$. A second comparator 22 also has one input connected to the node 10 and has another input connected to a second reference voltage source 24, which generates a second reference voltage $Uref_2$. The second comparator 22 supplies a second detection signal $D_2$, whose value changes if the capacitor voltage Uc on the node 10 passes the second reference voltage $Uref_2$. The second reference voltage $Uref_2$ has a value which lies between the first reference voltage $Uref_1$ and the residual voltage Ucr across the capacitor 8 immediately after the capacitor 8 has discharged via the discharge switch 12.

The detection signals $D_1$ and $D_2$ are applied to inputs of a microcontroller (also referred to as microprocessor) 26, which under control of a program stored in a ROM (read-only memory) 28 provides the timing of the measuring circuit and inter alia generates the switching signals $S_1$ and $S_2$ for controlling the discharge switch 12 and the parallel switch 16. The program of the microcontroller 26 has subroutines to count clock pulses (not shown) during time intervals defined by the detection signals $D_1$ and $D_2$, subroutines to store the counts in a RAM (random-access memory) 30, subroutines to perform mathematical operations on the counts and, depending on the use of the measuring circuit, subroutines to apply results of mathematical operations to, for example, a display 32 or a digital-to-analog converter 34.

The measuring circuit can measure the resistance value of the second resistor 14 if the resistance value of the first resistor 6 is known and vice versa. Thus, one of the two resistors functions as the known reference resistance and the other resistor is the unknown resistance to be measured. If the unknown resistance is an NTC (negative temperature coefficient) resistor the measured resistance will also be a measure of the temperature of this resistor. In that case it is also preferable to arrange the NTC resistor at the position of the second resistor 14. As will become apparent later on, the capacitor 8 is charged two times, one time via the first resistor 6 and one time via the first resistor 6 in parallel with the second resistor 14. By arranging the NTC resistor at the position of the second resistor 14 it is assured that the time constant for charging the capacitor 8 in the case of the parallel-connected resistors is smaller than in the case where the resistors are not in parallel. This simplifies the timing of the measuring circuit.

The operation of the measuring circuit will now be explained with reference to FIG. 2, which shows some signal waveforms. The discharge switch 12 opens at the instant $t_1$ and subsequently a first measurement is effected. The capacitor voltage Uc at this instant is equal to the first residual voltage $Ucr_1$, which is caused by the charging current through the discharge switch 12. The internal resistance of the discharge switch 12 is limited and can be a few hundreds of ohms in the case of transistor switches. The transistor switches are often incorporated in the microcontroller 26 and may exhibit a substantial spread in forward resistance. From the instant $t_1$ the capacitor voltage $U_c$ increases from the first residual voltage $Ucr_1$ with a first time constant $\tau_1$, which is determined by the resistance value $R_1$ of the first resistor 6 and the capacitance C of the capacitor 8 (FIG. 2 (a)). At the instant $t_2$ the capacitor voltage Uc reaches the value of the second reference voltage $Uref_2$ and the value of the second detection signal $D_2$ changes (FIG. 2 (d)). At the same instant a first clock-pulse count $CNT_1$ is started by the microcontroller 26. At the instant $t_3$ the capacitor voltage $U_c$ reaches the value of the first reference voltage $Uref_1$ and the value of the first detection signal $D_1$ changes (FIG. 2 (e)). The count $CNT_1$ now stops. The number of clock pulses $CNT_1$ is a measure of a first time interval $dt_1=t_3-t_2$ elapsing between passage of the second reference voltage $Uref_2$ and the first reference voltage $Uref_1$. The clock pulse count $CNT_1$ is subsequently stored in the RAM 30. For the calculation of the first time interval $dt_1$ it is assumed that: Udd=supply voltage on the positive supply terminal 2 relative to ground, $\tau_1=R_1*C$ en $t_1=0$. The capacitor voltage $U_c$ then varies in accordance with:

$$Uc(t) = Ucr_1 + (Udd - Ucr_1)\left(1 - e^{-\frac{t}{\tau_1}}\right) \quad (1)$$

$Uc(t_2)=Uref_2$ at the instant $t_2$ and $Uc(t_3)=Uref_1$ at the instant $t_3$. From equation (1) it now follows that:

$$dt_1 = t_3 - t_2 = -\tau_1 \ln\left[\frac{Udd - Uref_1}{Udd - Uref_2}\right] \quad (2)$$

Figure 2:
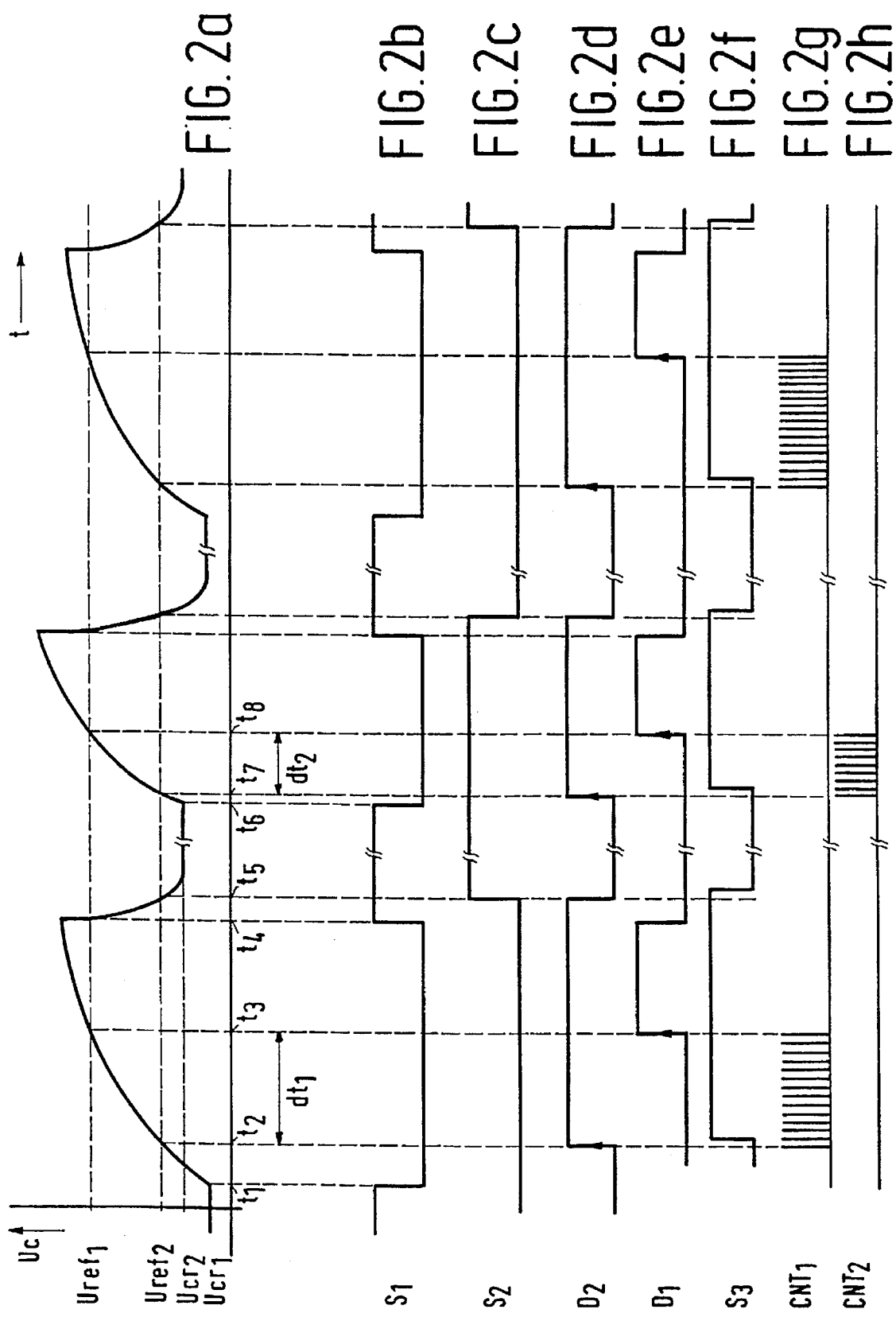
FIGS. 2a–2h show some waveforms of signals appearing in a measuring circuit in accordance with the invention.

After the instant $t_3$, at a suitable instant $t_4$, the capacitor 8 is discharged in response to a change of value of the first switching signal $S_1$ (FIG. 2 (b)). Slightly later at an instant $t_5$ the parallel switch 16 is also closed under command of the second switching signal $S_2$ (FIG. 2 (c)). The values of the detection signals $D_1$ and $D_2$ change as a result of the discharging process. The first resistor 6 and the second resistor 14 are now in parallel and a larger current flows through the discharge switch 12, so that the second residual voltage $Ucr_2$ is also higher than the first residual voltage $Ucr_1$. At the instant $t_6$ the discharge switch 12 opens again and a second measurement is now carrier out. From the instant $t_6$ the capacitor voltage $U_c$ increases from the second residual voltage $Ucr_2$ with a second time constant $\tau_2$, which is determined by the value $R_p$ of the first resistor 6 in parallel with the second resistor 14 and the capacitance C of the capacitor 8 (FIG. 2 (a)). At an instant $t_7$ the capacitor voltage Uc again reaches the second reference voltage $Uref_2$ and the value of the second detection signal $D_2$ changes again (FIG. 2 (d)). At the same instant a second clock-pulse count $CNT_2$ is started by the microcontroller 26. At an instant $t_8$ the capacitor voltage Uc reaches the first reference voltage $Uref_1$ and the value of the first detection signal $D_1$ changes again (FIG. 2 (e)). The count $CNT_2$ now stops. The clock pulse count $CNT_2$ is a measure of a second time interval $dt_2 = t_8 - t_7$ elapsing between passage of the second reference voltage $Uref_2$ and the first reference voltage $Uref_1$. The clock pulse count $CNT_2$ is subsequently stored in the RAM 30. For the calculation of the second time interval $dt_2$ it is further assumed that: $R_2$= the resistance value of the second resistor 14, $\tau_2 = R_p*C$, $R_p = R_1*R_2/(R_1+R_2)$ and $t_6=0$. The capacitor voltage Uc then varies in accordance with a formula comparable to formula (1). $Uc(t_7) = Uref_2$ at the instant $t_7$ and $Uc(t_8) = Uref_1$ at the instant $t_8$. From equation (1) it now follows that:

$$dt_2 = t_8 - t_7 = -\tau_2 \ln\left[\frac{Udd - Uref_1}{Udd - Uref_2}\right] \quad (3)$$

The resistance value $R_2$ for a given value of $R_1$ can now be calculated from the ratio between $dt_1$ and $dt_2$. It appears that the ratio is equal to $R_1/R_p$ and therefore only depends on the values of $R_1$ and $R_2$. The microcontroller 26 now performs a simple operation upon the counts $CNT_1$ and $CNT_2$ in order to calculate the value $R_2$ of the second resistor 14. If the second resistor 14 is an NTC resistor the value thus found is compared with a table in the ROM 28 and is converted to a signal whose value is representative of the temperature of the relevant NTC resistor. If the circuit is used in an electronic thermometer this temperature signal is shown on the display 32 in a suitable manner.

As is indicated in FIG. 2 (a), the discharging process of the capacitor 8 can be prolonged as required. Thus, the timing of the switching signals $S_1$ and $S_2$ can be chosen so as to ensure that the capacitor 8 is not discharged prematurely for any value of the time constant $\tau_2$. If the second resistor is an NTC resistor its resistance value can vary from some hundreds of kilo-ohms at low temperature to some hundreds of ohms at high temperature. Arranging the NTC resistor at the position of the second resistor 14 now ensures that the time constant for charging the capacitor 8 in the case of parallel-connected resistors is smaller than in the case where the resistors are not connected in parallel. Instead of a microcontroller with a RAM and a ROM it is, of course, also possible to use separate timers, counters, registers and the like for controlling the discharge switch 12 and the parallel switch 16 and for carrying out the mathematical operations. The discharge switch 12 and the parallel switch 16 can be constructed as relays with relay contacts or as transistor switches. The discharge switch 12 is, for example, an NMOS or NPN transistor and the parallel switch 16 a PMOS or PNP transistor.

Figure 3:
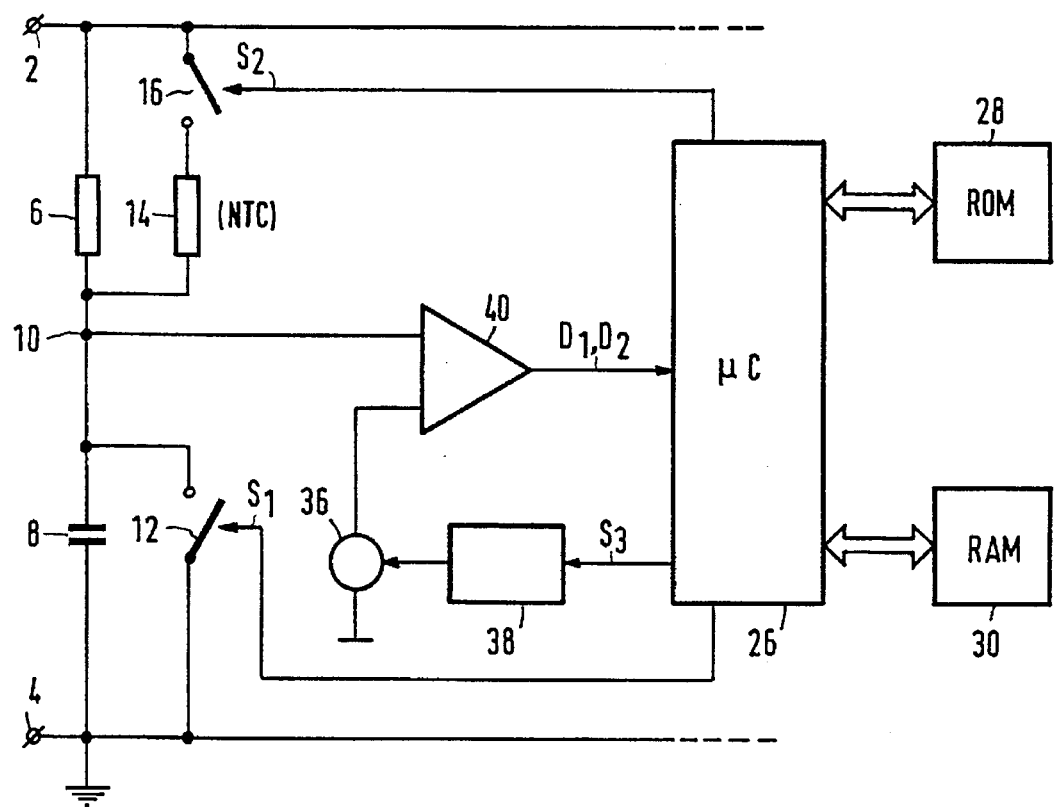
FIG. 3 shows a second circuit diagram of a measuring circuit in accordance with the invention.

FIG. 3 shows a simplified measuring circuit. The first reference voltage source 20 and the second reference voltage source 24 can be replaced by a single controllable voltage source 36 whose voltage is switched via an interface circuit 38 under control of a third switching signal $S_3$. FIG. 2 (f) shows the timing of this third switching signal $S_3$. Shortly after the capacitor voltage Uc has passed the second reference voltage $Uref_2$ ($t_2$, $t_7$) the reference voltage is switched from $Uref_2$ to $Uref_1$. Now only one comparator 40 is needed, which has one input connected to the node 10 and another input to the controllable voltage source 36.

In the measuring circuit shown in FIG. 1 the second resistor 14 is arranged in parallel with the first resistor 6 during the second measurement. The first resistor 6 is permanently connected to the capacitor 8. However, alternatively the capacitor 8 can be charged exclusively via the second resistor 14 during the second measurement. The first resistor 6 is then disconnected during the second measurement. The parallel switch 16 then becomes a change-over switch, which connects the first resistor 6 to the capacitor 8 during the first measurement and which connects the second resistor 14 to the capacitor 8 during the second measurement. This configuration again enables the value of the unknown resistance to be calculated from the measured time intervals. Such a change-over switch instead of the parallel switch 16 can also be used in the following embodiments and examples.

Figure 4:
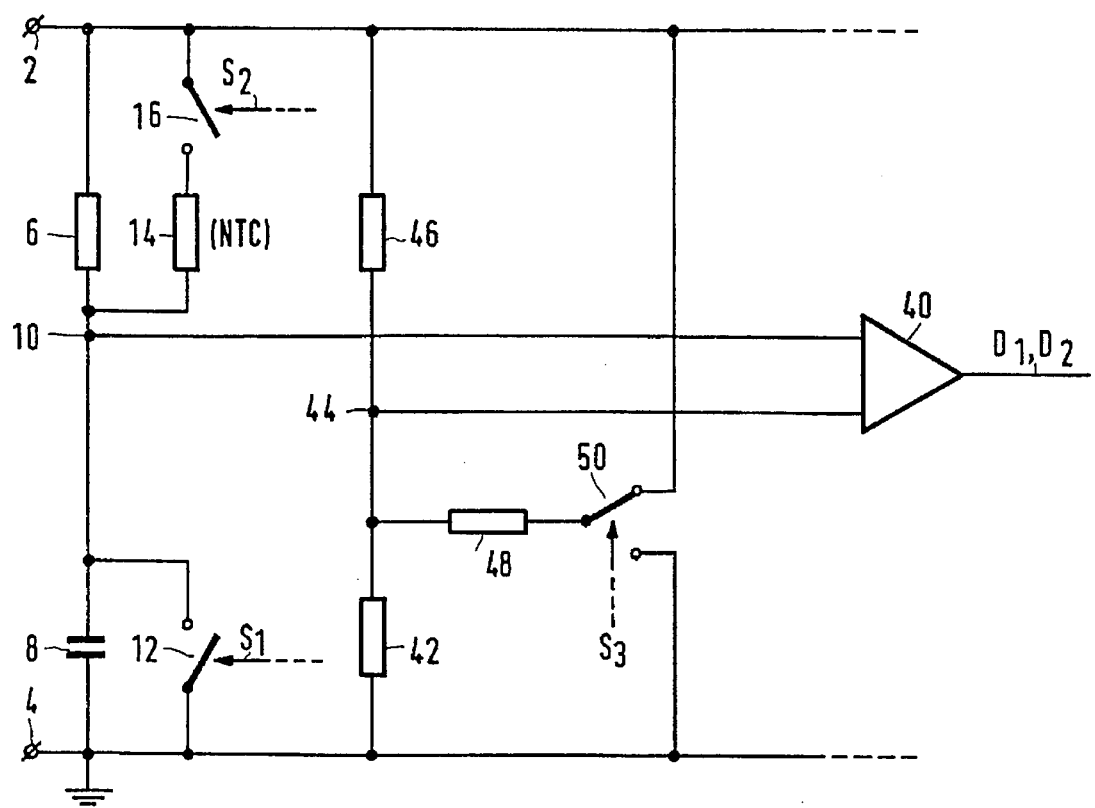
FIG. 4 shows a third circuit diagram of a measuring circuit in accordance with the invention.

FIG. 4 shows a measuring circuit which has been simplified even further. In the present case the controllable voltage source 36 and the interface circuit 38 are constructed with a third resistor 42 between the negative supply terminal 4 and a node 44, a fourth resistor 46 between the node 44 and the positive supply terminal 2, and a fifth resistor 48 having one end connected to the node 44, its other end being connectible to the positive supply terminal 2 or to the negative supply terminal 4 under control of the third switching signal $S_3$ via a change-over switch 4. The inputs of the comparator 40 are connected to the nodes 10 and 44. The comparatively low reference voltage $Uref_2$ is obtained by arranging the fifth resistor 48 in parallel with the third resistor 42. The comparatively high reference voltage $Uref_1$ is obtained by arranging the fifth resistor 48 in parallel with the fourth resistor 46.

Figure 5:
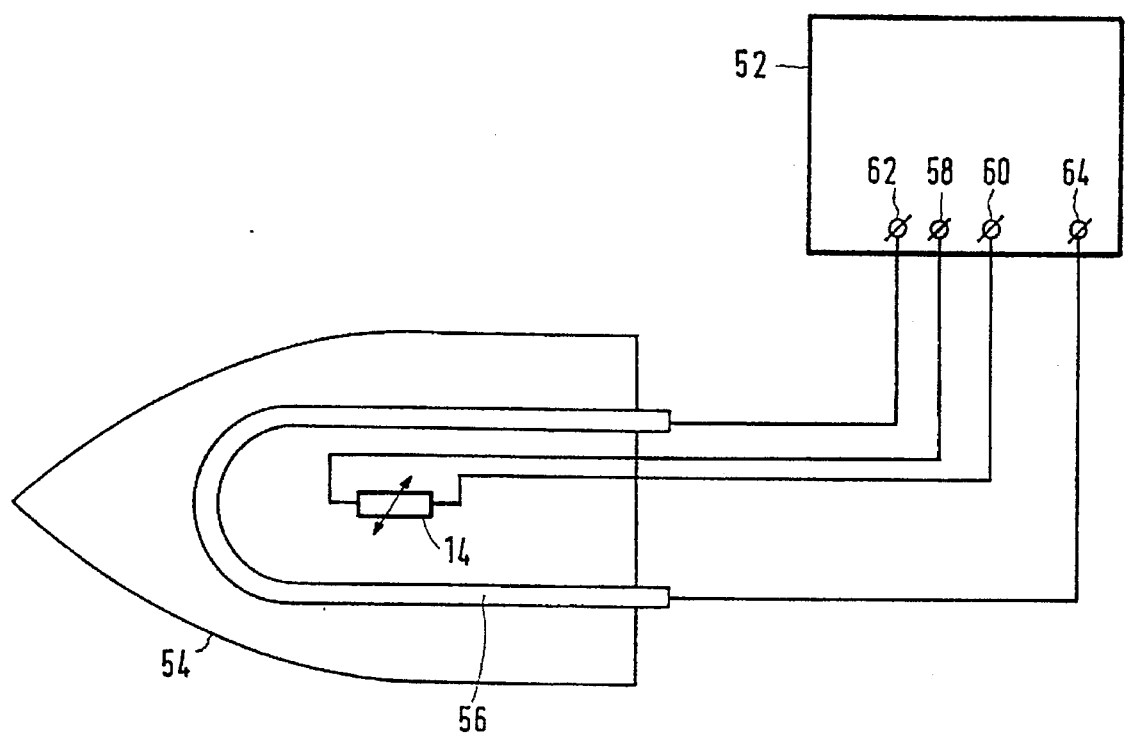
FIG. 5 shows an electrical connection diagram of a flat-iron including a measuring circuit in accordance with the invention.
Figure 6:
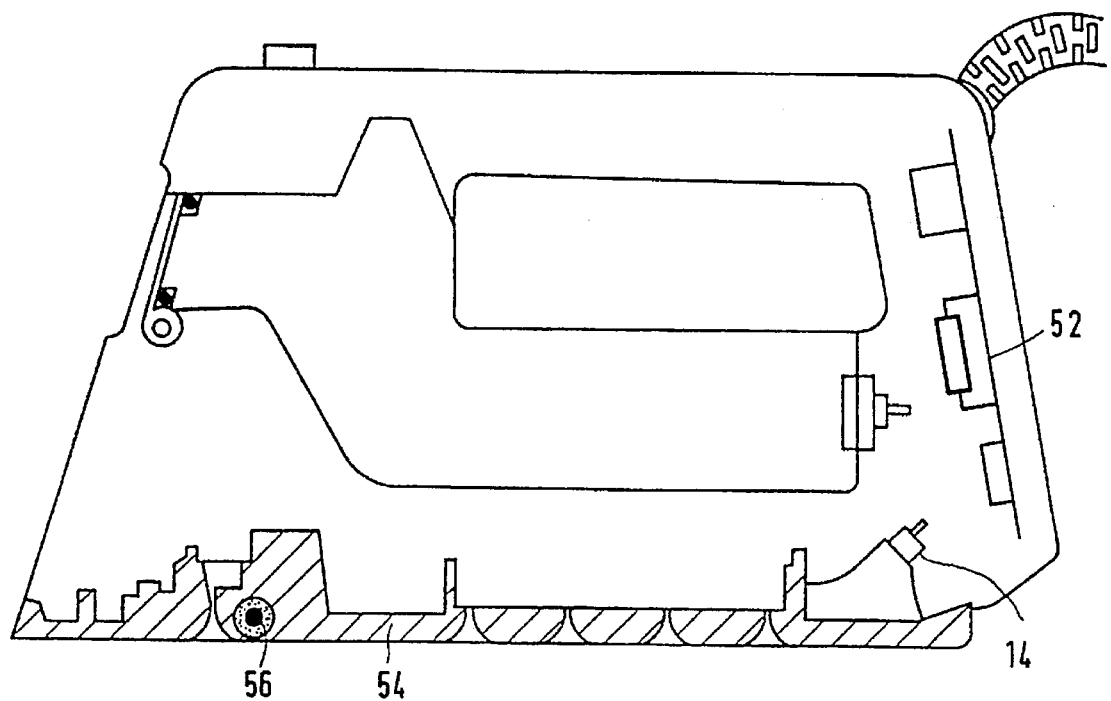
FIG. 6 is a sectional view of a flat-iron including a measuring circuit in accordance with the invention.
Figure 7:
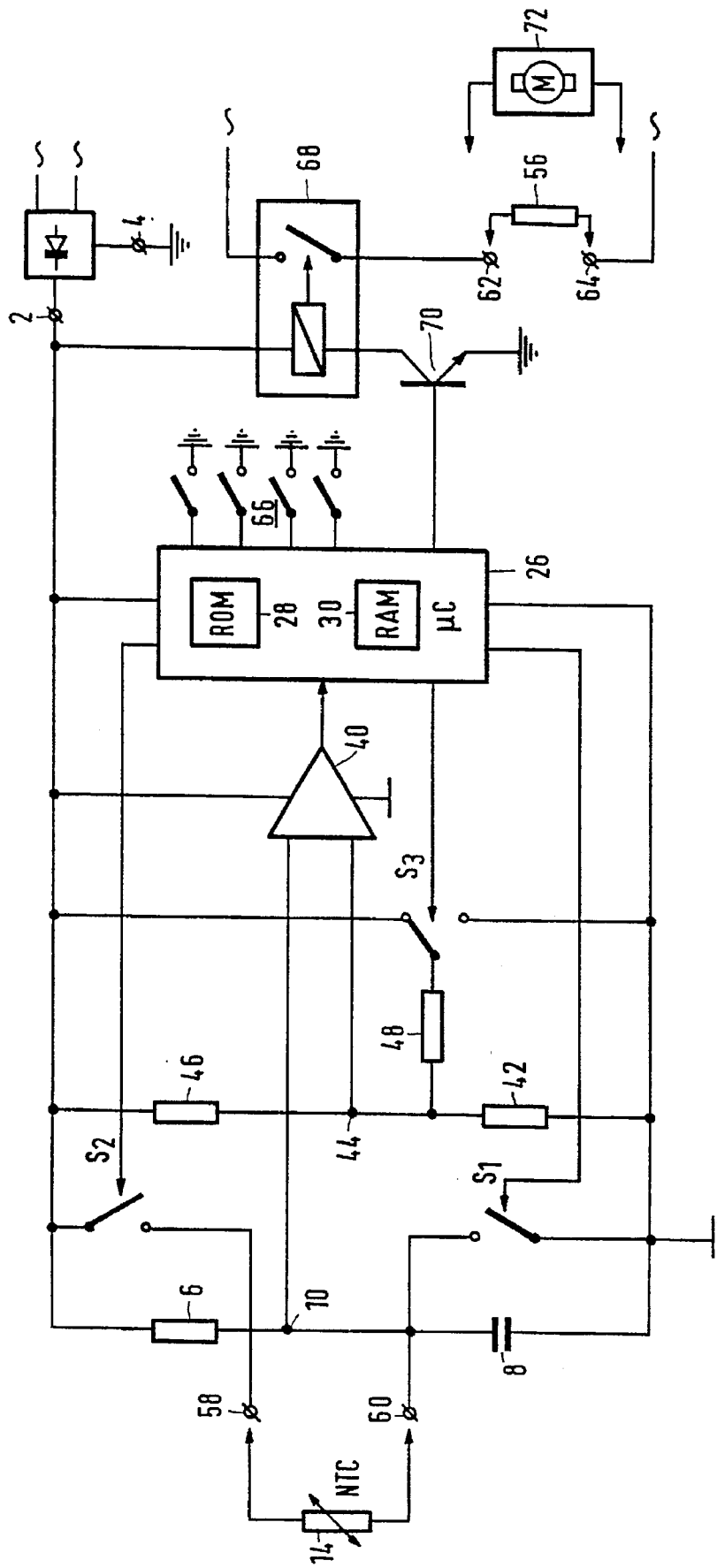
FIG. 7 shows a circuit diagram of a flat-iron including a measuring circuit in accordance with the invention.

FIG. 5 shows the measuring circuit used in a thermal appliance, for example, a flat-iron. The electronic parts are mounted on a printed circuit board 52. The second resistor 14 is an NTC resistor in thermal contact with the soleplate 54, which is heated by an electric heating element 56. The second resistor 14 is connected to a terminal 58 and a terminal 60, and the electric heating element 56 is connected to a terminal 62 and a terminal 64 of the printed circuit board 52. FIG. 6 is a sectional view of the iron and FIG. 7 shows the circuit diagram of the printed circuit board 52. The temperature of the soleplate 54 can be set by means of selector switches 66 connected to input ports of the microcontroller 26. The electric heating element 56 is turned on and turned off by means of a relay 68, which is energised by the microcontroller 26 via a control transistor 70. The measured temperature of the soleplate 54 is compared with the temperature set by means of the selector switches 66. If the temperature is too low the relay 68 is energised, as a result of which the electric heating element 56 is powered from the a.c. mains and heats the soleplate 54. When the desired temperature is reached the relay is de-energised and the power supply to the electric heating element 56 is interrupted.

The circuit shown in FIG. 7 is also suitable for use in other thermal appliances having a heating element, with or without temperature control, such as coffee makers, electric kettles, deep fryers, roasters, cook-tops, ovens, grills, hotplates, room-heating appliances, radiant heaters, fan heaters, hair dryers, hair curlers, bread toasters, sandwich toasters, electric blankets and the like.

If instead of the electric heating element 56 a cooling unit 72 is used, the circuit shown in FIG. 7 can also be used in cold-generating appliances such as icemakers, food processors, refrigerators, deepfreezers, air conditioners and the like.

I claim:

1. A measuring circuit for measuring the resistance value of a resistor, wherein the measuring circuit comprises:
    a capacitor,
    a first resistor and a second resistor which can be coupled to the capacitor for charging the capacitor to a capacitor voltage (Uc), one resistor of the first and second resistors being the resistor whose resistance value is measured,
    discharge means for discharging the capacitor,
    a first reference voltage source for generating a first reference voltage ($U_{ref_1}$),
    first comparison means for comparing the capacitor voltage (Uc) with the first reference voltage ($U_{ref_1}$) and for generating a first detection signal ($D_1$) when the capacitor voltage (Uc) passes the first reference voltage ($U_{ref_1}$),
    time measurement means for measuring a first time interval which, after discharge of the capacitor by the discharge means, terminates upon the occurrence of the first detection signal during charging of the capacitor via the first resistor, and for measuring a second time interval which, after discharge of the capacitor by the discharge means, terminates upon the occurrence of the first detection signal during charging of the capacitor via at least the second resistor, whereby the resistance value of the one resistor is determined as a function of said first and second time intervals, and wherein the measuring circuit further comprises:
    a second reference voltage source for supplying a second reference voltage ($U_{ref_2}$) which lies between the first reference voltage ($U_{ref_1}$) and the capacitor voltage immediately after discharge of the capacitor, and
    second comparison means for comparing the capacitor voltage (Uc) with the second reference voltage ($U_{ref_2}$) and for generating a second detection signal ($D_2$) when the capacitor voltage (Uc) passes the second reference voltage ($U_{ref_2}$), wherein
    the first time interval and the second time interval start upon the occurrence of the second detection signal ($D_2$).

2. A measuring circuit as claimed in claim 1, wherein the first comparison means and the second comparison means are united in a single comparator, and the first reference voltage source and the second reference voltage source are united in a single reference voltage source whose reference voltage is switchable from the second reference voltage to the first reference voltage after the occurrence of the second detection signal.

3. A measuring circuit as claimed in claim 2, wherein the one resistor is the second resistor and is a temperature-dependent resistor.

4. A measuring circuit as claimed in claim 2, wherein the single reference voltage source comprises:
    a voltage divider including a series arrangement of a third resistor and a fourth resistor,
    a fifth resistor, and
    switching means for connecting the fifth resistor and the third resistor in parallel before the occurrence of the second detection signal and for connecting the fifth resistor and the fourth resistor in parallel after the occurrence of the second detection signal.

5. A measuring circuit as claimed in claim 4, wherein the second resistor is the one resistor and is a temperature-dependent resistor.

6. A measuring circuit as claimed in claim 4, wherein the discharge means and the switching means are transistors.

7. A measuring circuit as claimed in claim 1, wherein the second resistor is the one resistor and is a temperature-dependent resistor.

8. A measuring circuit as claimed in claim 1, wherein the capacitor is coupled to a voltage source via the one resistor and switching means, and wherein
    the capacitor discharge means and the switching means comprise respective transistors.

9. A thermal appliance, which comprises:
    an electric heating element,
    a measuring circuit as claimed in claim 1, wherein the one resistor comprises a temperature-sensitive resistor, and
    means for controlling the supply of power to the electric heating element in response to the resistance value of the temperature-sensitive resistor.

10. A thermal appliance as claimed in claim 9, wherein the thermal appliance is an appliance of the group including: a flat-iron, coffee maker, electric kettle, deep fryer, roaster, cook-top, oven, grill, hot-plate, room-heating appliance, radiant heater, fan heater, hair dryer, hair curler, bread toaster, sandwich toaster, electric blanket.

11. An electrical thermometer which comprises:
    a measuring circuit as claimed in claim 1, wherein the one of the first resistor and the second resistor comprises a temperature-sensitive resistor.
    a device for supplying an electric signal which is representative of the resistance value of the temperature-sensitive resistor, and
    an indicator device for indicating a temperature in response to the electric signal.

12. A cold-generating appliance, which comprises:
    a cooling unit,
    a measuring circuit as claimed in claim 1, wherein the one of the first resistor and the second resistor comprises a temperature-sensitive resistor, and
    means for controlling the cooling unit in response to the resistance value of the temperature-sensitive resistor.

13. A cold-generating appliance as claimed in claim 12, wherein the appliance is an appliance of the group including: an icemaker, food processor, refrigerator, deepfreezer, air conditioner.

14. A thermal appliance which comprises:
    an electric heating element,
    a measuring circuit as claimed in claim 2, wherein the one resistor comprises a temperature-sensitive resistor, and
    means for controlling the supply of power to the electric heating element in response to the resistance value of the temperature-sensitive resistor.

15. A thermal appliance which comprises:
an electric heating element,
a measuring circuit as claimed in claim 4, wherein the one of the first resistor and the second resistor comprises a temperature-sensitive resistor, and
means for controlling the supply of power to the electric heating element in response to the resistance value of the temperature-sensitive resistor.

16. An electric thermometer which comprises:
a measuring circuit as claimed in claim 2, wherein the one of the first resistor and the second resistor comprises a temperature-sensitive resistor,
a device for supplying an electric signal which is representative of the resistance value of the temperature-sensitive resistor, and
an indicator device for indicating a temperature in response to the electric signal.

17. An electric thermometer which comprises:
a measuring circuit as claimed in claim 4, wherein the one of the first resistor and the second resistor comprises a temperature-sensitive resistor,
a device for supplying an electric signal which is representative of the resistance value of the temperature-sensitive resistor, and
an indicator device for indicating a temperature in response to the electric signal.

18. A cold-generating appliance, which comprises:
a cooling unit,
a measuring circuit as claimed in claim 4, wherein the one of the first resistor and the second resistor comprises a temperature-sensitive resistor, and
means for controlling the cooling unit in response to the resistance value of the temperature-sensitive resistor.

19. A method of measuring the resistance of an unknown resistor comprising:
charging a capacitor to a first reference voltage via a reference resistor during a first time interval that commences at a time when the capacitor voltage is greater than a residual voltage present on the capacitor at the end of the discharge of the capacitor,
discharging the capacitor to said residual voltage at a time subsequent to the first time interval,
charging the capacitor to the first reference voltage via at least the unknown resistor during a second time interval that commences at a time when the capacitor voltage is greater than the residual voltage present on the capacitor at the end of the discharge of the capacitor,
discharging the capacitor to a residual voltage at a time subsequent to the second time interval, and
determining the resistance of the unknown resistor from the ratio of the first and second time intervals.

20. The method as claimed in claim 19 which further comprises:
deriving a second reference voltage which is higher than the capacitor residual voltage but lower than the first reference voltage, and
detecting when the capacitor charging voltage passes through the second reference voltage thereby to start the respective first and second time intervals.

21. The method as claimed in claim 20 which further comprises:
detecting when the capacitor charging voltage passes through the first reference voltage thereby to end the respective first and second time intervals.

22. A measuring circuit for measuring the resistance value of a given resistor comprising:
a capacitor,
a reference resistor,
means for coupling the capacitor to a source of voltage for charging the capacitor to a capacitor voltage via at least one of said given resistor and said reference resistor,
discharge means switchably coupled to the capacitor for discharging the capacitor to a residual voltage,
switching means for coupling the capacitor to said source of voltage via at least the other one of said given resistor and said reference resistor,
a first reference voltage source providing a first reference voltage,
comparison means for comparing the capacitor voltage with the first reference voltage and for generating a first detection signal when the capacitor voltage passes the first reference voltage,
a second reference voltage source providing a second reference voltage of a value between the first reference voltage and the capacitor residual voltage, wherein said comparison means compares the capacitor voltage to the second reference voltage so as to generate a second detection signal when the capacitor voltage passes the second reference voltage, and
control means responsive to said first and second detection signals for deriving first and second control signals for control of the discharge means and the switching means, respectively, so as to derive first and second time intervals which determine the resistance value of said given resistor and independently of the residual voltage.

23. The measuring circuit as claimed in claim 22 wherein the control means is responsive to the second detection signal to start the first time interval and the second time interval and also controls the switching means in response to the second detection signal.

24. The measuring circuit as claimed in claim 23 wherein the switching means couples the given resistor and the reference resistor in parallel in response to the second control signal, and said control means includes means for determining the resistance value of the given resistor as a function of the ratio of said first and second time intervals.

25. The measuring circuit as claimed in claim 22 wherein the reference resistor is connected in series with the capacitor to said source of voltage and the control means is responsive to the second detection signal to generate the second control signal for switching the switching means so that the given resistor is in parallel with the reference resistor during the second time interval.

26. The measuring circuit as claimed in claim 22 wherein said comparison means comprises first and second comparators each having a first input coupled to the capacitor and a second input coupled to respective ones of said first and second reference voltage sources thereby to derive said first and second detection voltages, respectively.

27. The measuring circuit as claimed in claim 22 wherein said comparison means comprise a single comparator having one input coupled to the capacitor and the first and second reference voltage sources comprise a single reference voltage source coupled to a second input of the single comparator and responsive to a third control signal generated by the control means thereby to switch the level of its reference voltage from the second reference voltage to the first reference voltage upon the occurrence of the second detection signal.

28. The measuring circuit as claimed in claim 22 wherein said comparison means comprise a single comparator and the first and second reference voltage sources comprise a single reference voltage source, and said single reference voltage source comprises:

a voltage divider comprising first and second resistors connected in series circuit to said source of voltage, a third resistor, and second switching means responsive to a third control signal generated by the control means for coupling the third resistor and the first resistor in parallel prior to the occurrence of the second detection signal and for coupling the third resistor and the second resistor in parallel after the occurrence of the second detection signal.

29. The measuring circuit as claimed in claim 22 wherein said given resistor comprises a temperature-dependent resistance.

30. The measuring circuit as claimed in claim 22 wherein one of said given resistor and said reference resistor comprises a temperature-dependent resistor.

* * * * *